(12) United States Patent
Chiou et al.

(10) Patent No.: US 7,946,050 B2
(45) Date of Patent: May 24, 2011

(54) THREE-DIMENSIONAL MICROPROBE ARRAY

(75) Inventors: Jin-Chern Chiou, Hsinchu (TW);
Chih-Wei Chang, Yangmei Township, Taoyuan County (TW)

(73) Assignee: National Chiao Tung University, Hsinchu (TW)

( * ) Notice: Subject to any disclaimer, the term of this patent is extended or adjusted under 35 U.S.C. 154(b) by 360 days.

(21) Appl. No.: 12/128,804

(22) Filed: May 29, 2008

(65) Prior Publication Data

US 2009/0120216 A1 May 14, 2009

(30) Foreign Application Priority Data

Nov. 9, 2007 (TW) .............................. 96142516 A

(51) Int. Cl.
*G01D 13/00* (2006.01)
*G01R 31/00* (2006.01)
(52) U.S. Cl. ....... 33/557; 33/560; 73/866.5; 324/754.07
(58) Field of Classification Search .................... 33/503, 33/557, 560; 73/866.5; 324/754, 754.01, 324/754.03, 754.07, 754.18, 755.01, 755.03, 324/755.08, 755.11, FOR. 100
See application file for complete search history.

(56) References Cited

U.S. PATENT DOCUMENTS

| | | | | |
|---|---|---|---|---|
| 4,578,279 A | * | 3/1986 | Zingher | 427/10 |
| 5,091,694 A | * | 2/1992 | Ikeda et al. | 324/754 |
| 5,475,318 A | * | 12/1995 | Marcus et al. | 324/762 |
| 5,724,315 A | * | 3/1998 | Moffett et al. | 367/153 |
| 6,245,444 B1 | * | 6/2001 | Marcus et al. | 428/616 |
| 6,359,757 B1 | * | 3/2002 | Mallary | 360/294.3 |
| 7,304,486 B2 | * | 12/2007 | Petersen et al. | 324/754 |
| 7,531,077 B2 | * | 5/2009 | Cohen et al. | 205/118 |
| 7,567,089 B2 | * | 7/2009 | Chen et al. | 324/754 |
| 2005/0223543 A1 | * | 10/2005 | Cohen et al. | 29/602.1 |
| 2006/0212978 A1 | * | 9/2006 | Brandenberger et al. | 977/858 |
| 2008/0009763 A1 | * | 1/2008 | Chiou et al. | 600/544 |
| 2010/0178810 A2 | * | 7/2010 | Aarts et al. | 439/676 |

FOREIGN PATENT DOCUMENTS

| | | |
|---|---|---|
| TW | I224676 | 12/2004 |
| WO | WO 2005065437 A2 * | 7/2005 |
| WO | WO 2006031280 A2 * | 3/2006 |
| WO | WO 2007148890 A1 * | 12/2007 |

OTHER PUBLICATIONS

TDB-ACC-NO: NN9505131, "Microprobe Structure for Solder-Bump Contact", IBM Technical Disclosure Bulletin, May 1995, vol. 38, No. 5, pp. 131-134, (Figs. 1-2d not readily aavailable).*
Daryl R. Kipke, Rio J. Vetter, Justin C. Williams, and Jamille F. Hetke, "Silicon Substrate Intracortical Microelectrode Arrays for Long-Term Recording of Neuronal Spike Activity in Cerebral Cortex", IEEE Transactions on Neural Systems and Rehabilitation Engineering, vol. 11, No. 2, Jun. 2003, pp. 151-155.

(Continued)

*Primary Examiner* — Thomas P Noland
(74) *Attorney, Agent, or Firm* — Rosenberg, Klein & Lee

(57) ABSTRACT

The present invention discloses a three-dimensional microprobe array assembly structure, wherein spacers are used in assembling edge-type microprobe arrays to form a three-dimensional structure, and the spacers reveal conductive pads of the edge-type microprobe arrays to benefit wire bonding. The present invention detects depths and angles and thus increases detection reliability. Besides, in the present invention, the related IC is integrated with the spacer to achieve circuit integration and reduce cost.

20 Claims, 13 Drawing Sheets

OTHER PUBLICATIONS

Jozsef Csicsvari, Darrell A. Henze, Brian Jamieson, Kenneth D. Harris, Anton Sirota, P'eter Barth, Kensall D. Wise, and György Buzsáki, "Massively Parallel Recording of Unit and Local Field Potentials With Silicon-Based Electrodes", J Neurophysiol 90: 1314-1323, Aug. 2003, György Buzsáki.

Rio J. Vetter, Justin C. Williams, Jamille F. Hetke, Elizabeth A. Nunamaker, and Daryl R. Kipke, "Chronic Neural Recording Using Silicon-Substrate Microelectrode Arrays Implanted in Cerebral Cortex" IEEE Transactions on Biomedical Engineering, vol. 51, No. 6, Jun. 2004, pp. 896-904.

Qing Bai, Kensall D. Wise, and David J. Anderson, "A High-Yield Microassembly Structure for Three-Dimensional Microelectrode Arrays", IEEE Transactions on Biomedical Engineering, vol. 47, No. 3, Mar. 2000, pp. 281-289.

* cited by examiner

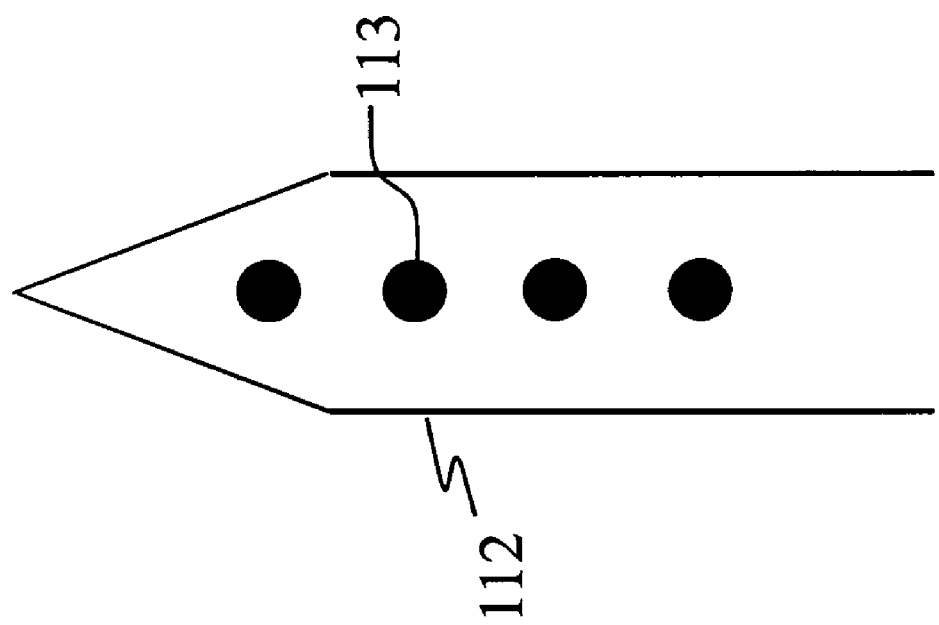

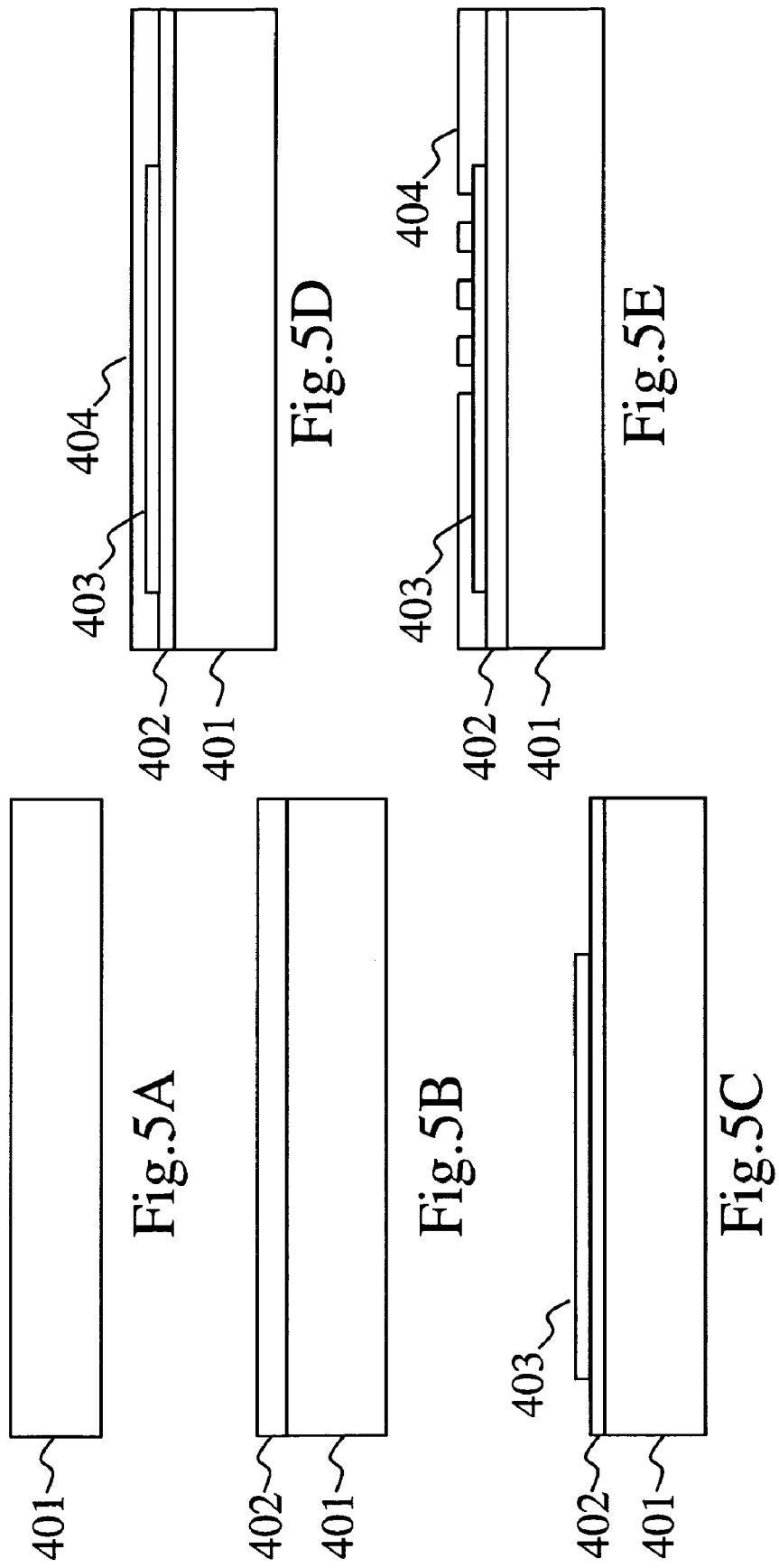

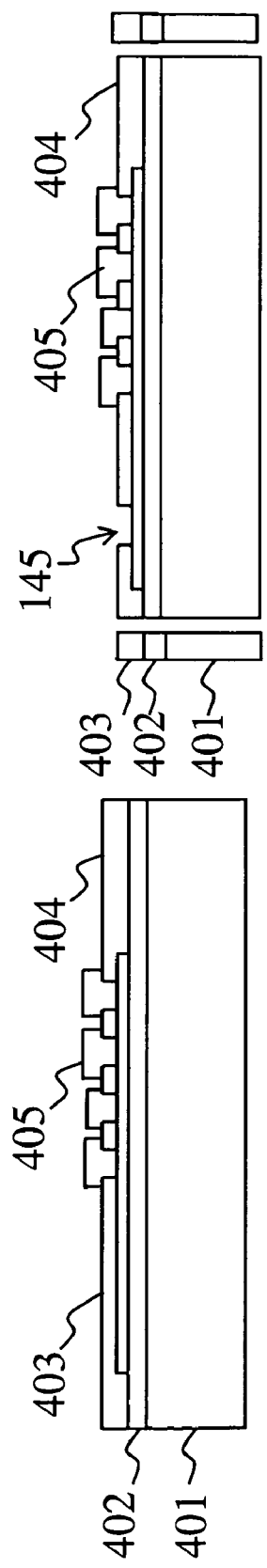
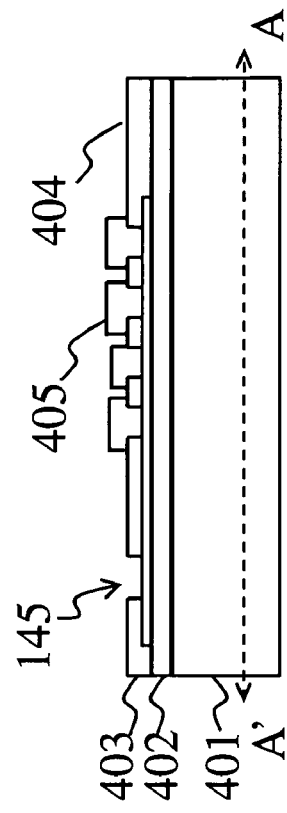
Fig.5F
Fig.5G
Fig.5H
Fig.5I

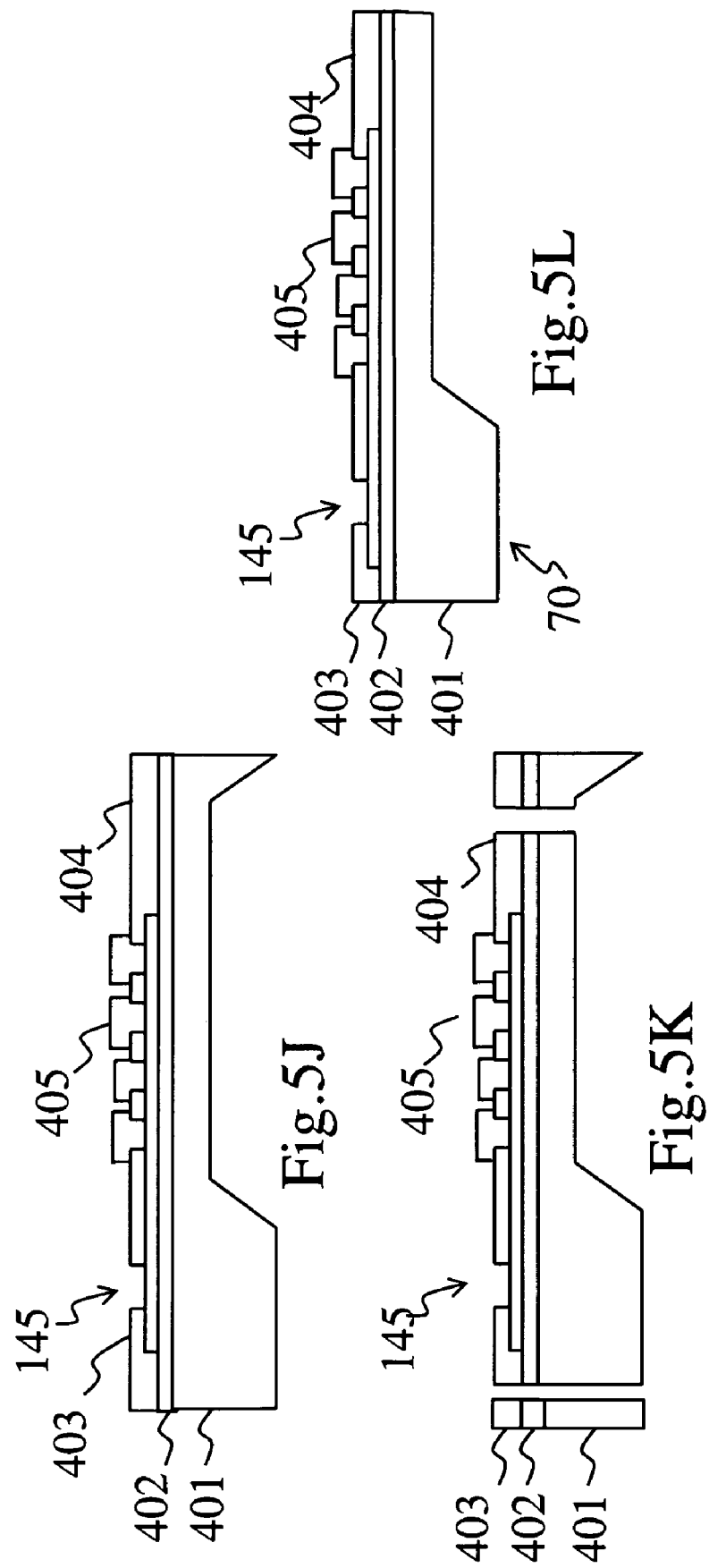

THREE-DIMENSIONAL MICROPROBE ARRAY

BACKGROUND OF THE INVENTION

1. Field of the Invention

The present invention relates to a microprobe structure, particularly to a three-dimensional microprobe array assembly structure with depth and angle detection.

2. Description of the Related Art

Probes have been widely used in many fields, such as biochips and semiconductor tests. With the advance of science and technology, test samples are also being miniaturized, and probes thus require higher precision. Hence, more and more personnel have been devoted to related researches and developments.

Daryl R. Kipke et al. published in IEEE a "Silicon Substrate Intracortical Microelectrode Array for Long-Term Recording of Neuronal Spike Activity in Cerebral Cortex", which is a single-piece edge-type microprobe array, wherein IC is built in the probe substrate. Its disadvantage is that additional substrate area needs preparing for probes in IC fabrication. Thus, the area and cost increases. Besides, it does not reveal the design of a three-dimensional probe array.

Qing Bai et al. proposed a "High-Yield Microassembly Structure for Three-Dimensional Microelectrode Arrays", wherein general single-piece edge-type microprobe arrays are sequentially inserted into the pre-fabricated holes of a substrate. Such a technology can indeed achieve a three-dimensional microelectrode array. However, the joint of the single-piece edge-type microprobe arrays and the substrate needs ultrasonic welding, which increases technical complexity. Further, such an assembly structure also has the disadvantages of the single-piece edge-type microprobe array—bulky volume and higher cost.

A Taiwan patent No. I224676 disclosed a "Method for Fabricating a Three-Dimensional Probe Array", wherein a stack of a three-dimensional probe array is formed with several cycles of exposures and developments. However, the more cycles of exposures and developments, the greater the accumulated alignment error. Besides, the probe of this technology cannot have several independent sensing electrodes, which the probe of a general edge-type microprobe array should have.

On the whole, the abovementioned prior arts are all unlikely to detect depths and angles. Thus, the reliability of measurement is influenced, which will be a big problem in detecting a miniature object.

SUMMARY OF THE INVENTION

The primary object of the present invention is to provide a novel three-dimensional microprobe array assembly structure to replace current technologies, wherein the present invention has the advantages of easy assemblage, small volume and lower IC-integration cost.

Another object of the present invention is to provide a three-dimensional microprobe array assembly structure, whereby mechanisms for detecting depths and angles can be developed to achieve higher detection reliability.

To achieve the abovementioned objectives, the present invention proposes a three-dimensional microprobe array assembly structure, wherein spacers are used in stacking single-piece edge-type microprobe arrays to form a three-dimensional structure, and wherein a special design of spacers and edge-type microprobe arrays simplifies wire connection. The three-dimensional microprobe array assembly structure of the present invention comprises at least two edge-type microprobe arrays. Each edge-type microprobe array has a substrate. The substrate has at least two microprobes at the front thereof. Each microprobe is connected to several conductive pads of the substrate via several wires. In the present invention, a spacer interposes between two edge-type microprobe arrays but reveals the conductive pads of the edge-type microprobe arrays. In the present invention, the IC substrate is used as the spacer, which benefits circuit integration and reduces fabrication cost. In the present invention, the microprobe has mechanisms to detect depths and angles, which increases detection reliability.

Below, the present invention is described in detail in cooperation with the drawings to make easily understood the objectives, characteristics and efficacies of the present invention.

BRIEF DESCRIPTION OF THE DRAWINGS

FIG. 1B is a locally enlarged view of a microprobe having a plurality of sensing electrodes according to one embodiment of the present invention;

FIG. 5A to FIG. 5I are diagrams schematically showing the fabrication process of an edge-type microprobe array according to one embodiment of the present invention;

FIG. 5J to FIG. 5L are diagrams schematically showing the fabrication process of directly fabricating a spacer on an edge-type microprobe array according to one embodiment of the present invention;

DETAILED DESCRIPTION OF THE INVENTION

Figure 1A:
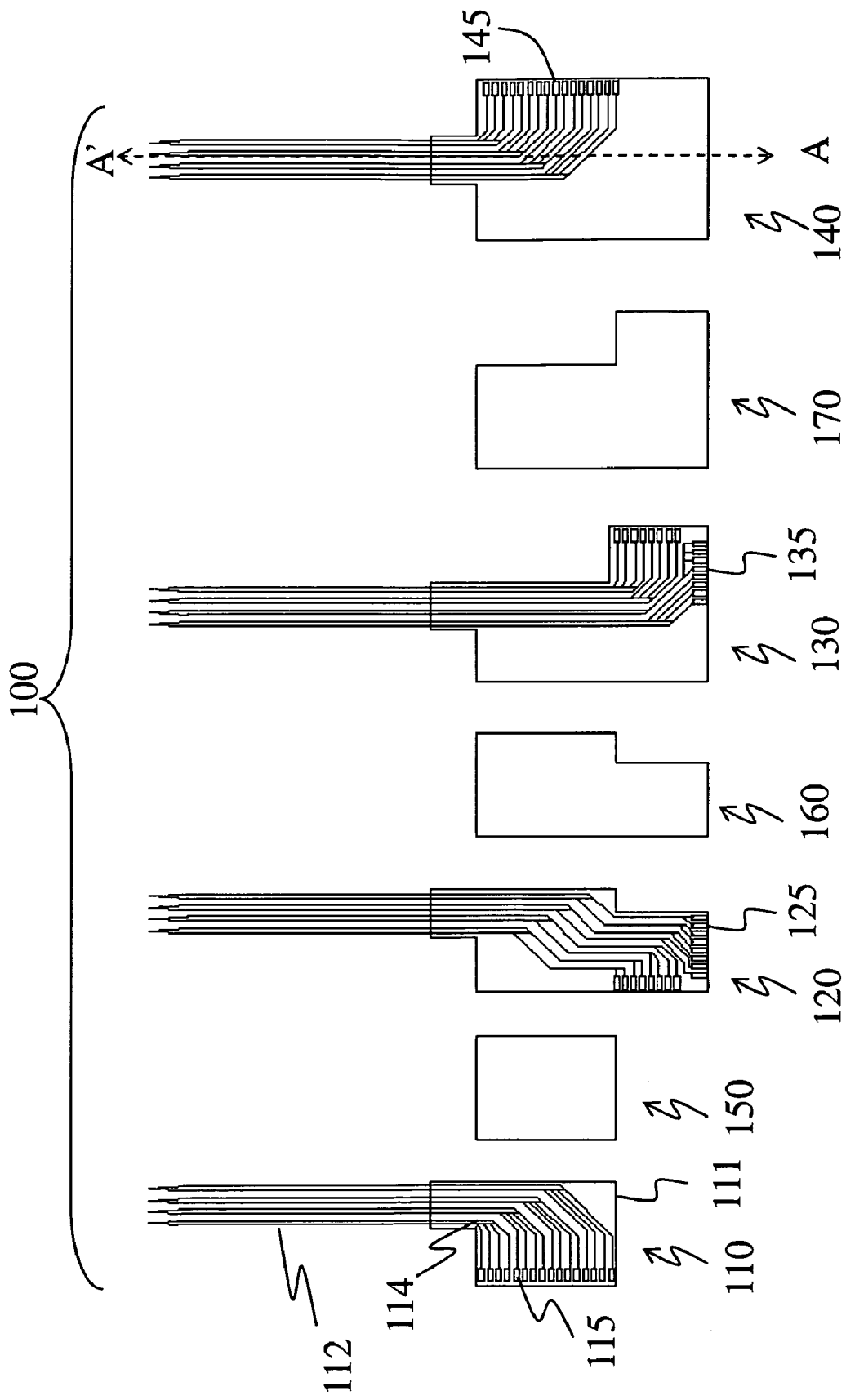
FIG. 1A is an exploded view of a three-dimensional microprobe array assembly structure according to one embodiment of the present invention.

Refer to FIG. 1A an exploded view of a three-dimensional microprobe array assembly structure according to one embodiment of the present invention. In this embodiment, a 4×4 three-dimensional microprobe array 100 is formed of four edge-type microprobe arrays 110, 120, 130 and 140, and three spacers 150, 160 and 170. Below, the edge-type microprobe array 110 is used as the exemplification of the edge-type microprobe arrays. The edge-type microprobe array 110 has a substrate 111 and four microprobes 112 at the front of the substrate 111. Refer to FIG. 1B. Each microprobe 112 has a plurality of sensing electrodes 113. The sensing electrodes 113 are respectively arranged in the front, middle, rear, or other positions of the microprobe 112. Each microprobe 112 is connected with a plurality of conductive pads 115 of the substrate 111 via a plurality of wires 114.

Described in detail, the three-dimensional microprobe array 100 comprises: a first edge-type microprobe array 110, a second edge-type microprobe array 120, a third edge-type microprobe array 130, a fourth edge-type microprobe array 140, a first spacer 150, a second spacer 160 and a third spacer 170. The first spacer 150 is designed to reveal the conductive pads 115 of the first edge-type microprobe array 110. The second spacer 160 is designed to reveal the conductive pads 125 of the second edge-type microprobe array 120. Similarly, the third spacer 170 is designed to reveal the conductive pads 135 of the third edge-type microprobe array 130.

Figure 2A:
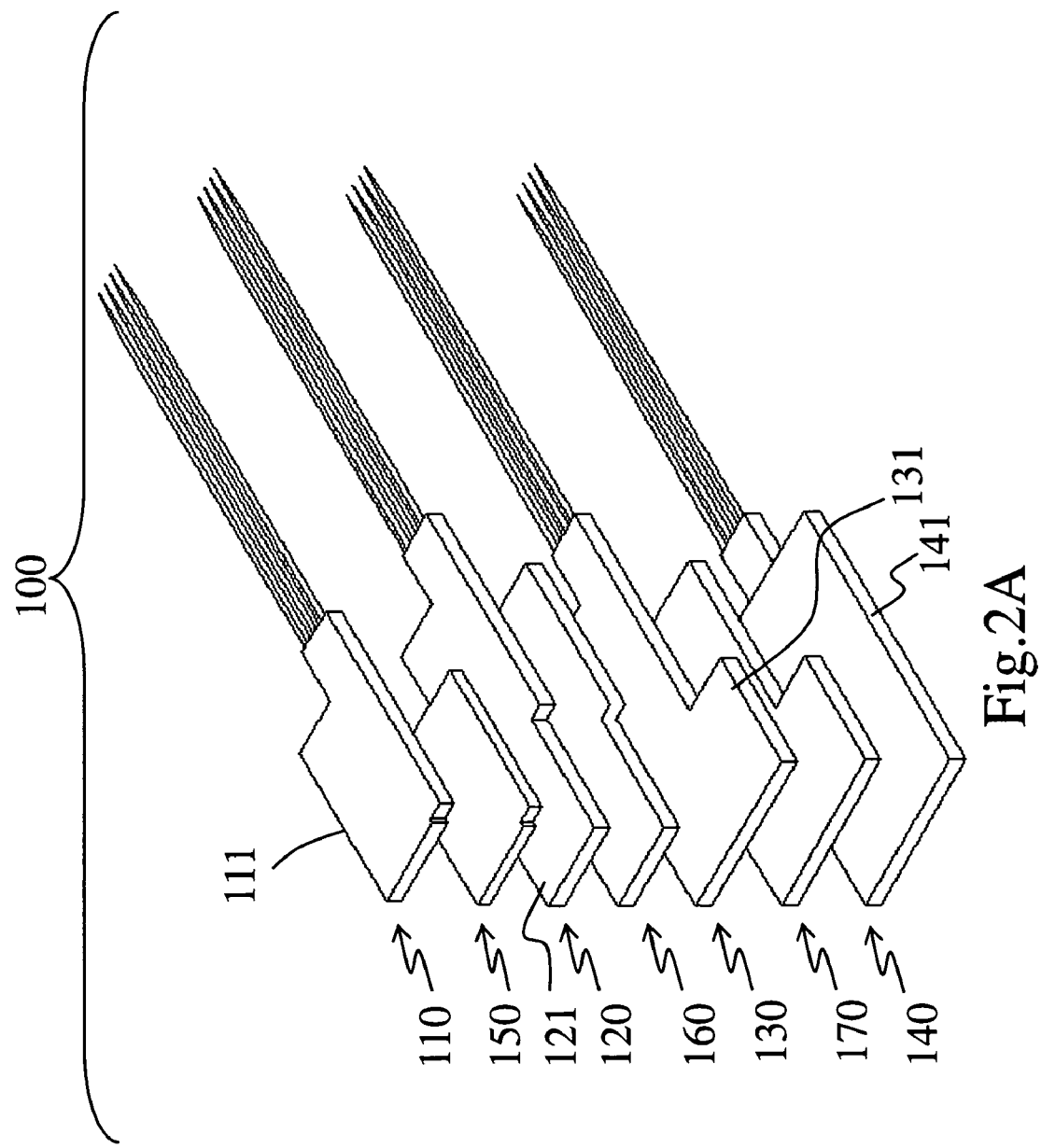
FIG. 2A and FIG. 2B are respectively an exploded view and a perspective view of an assembly structure for a three-dimensional microprobe array assembly structure according to one embodiment of the present invention.
Figure 2B:
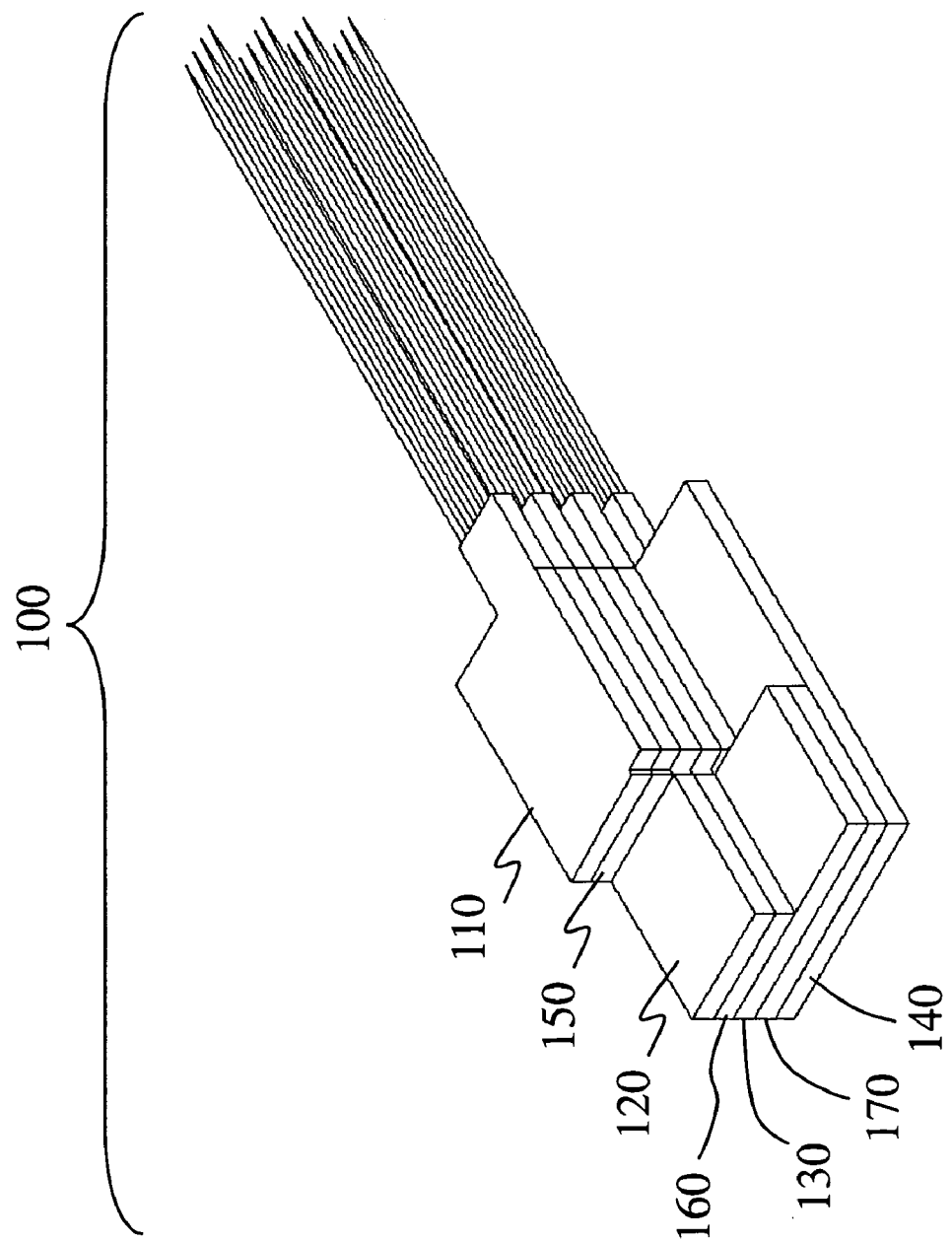
Figure 3:
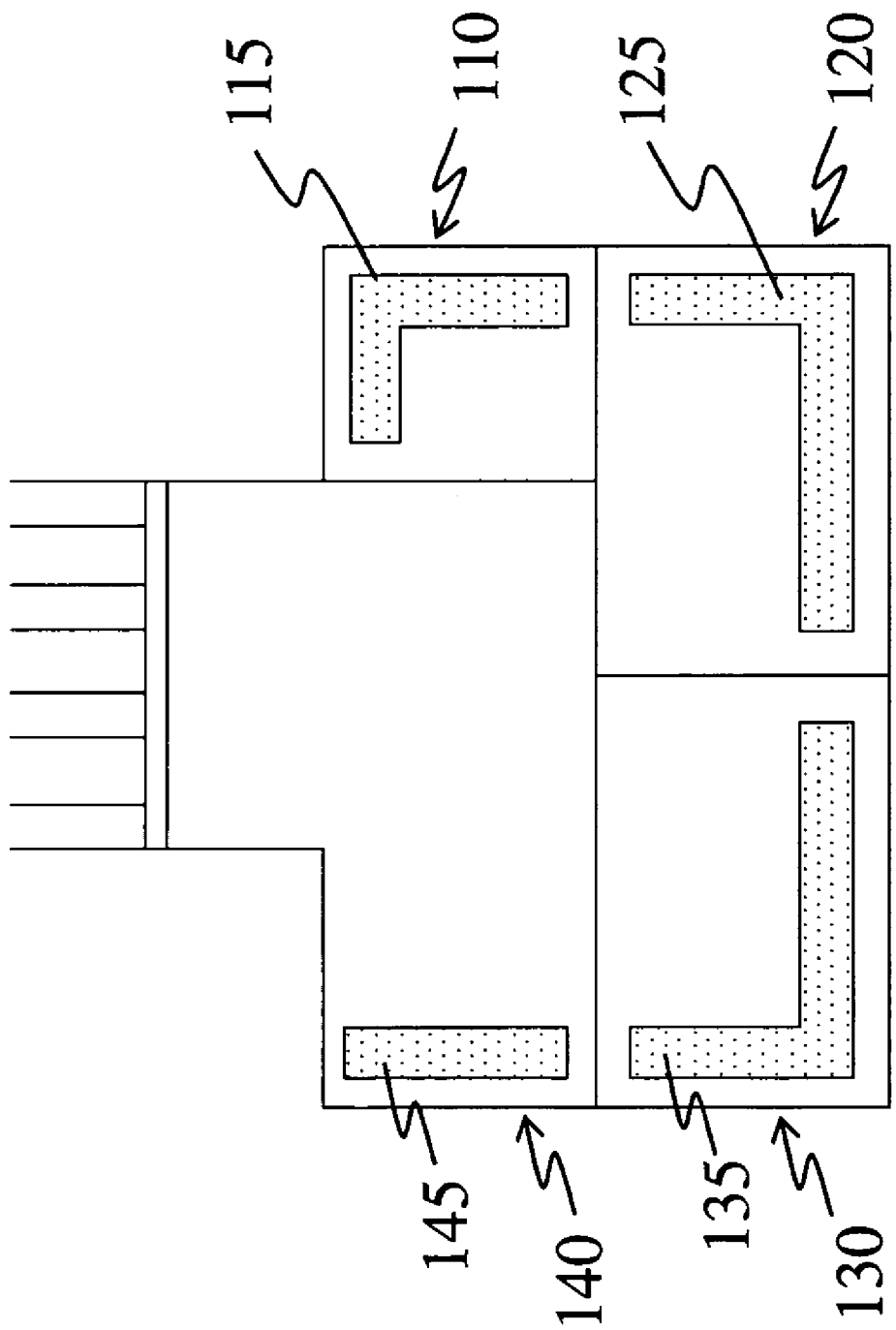
FIG. 3 is a diagram schematically showing an assembly structure for a three-dimensional microprobe array assembly structure according to one embodiment of the present invention.

Refer to FIG. 2A and FIG. 2B respectively an exploded view and a perspective view of an assembly structure for a three-dimensional microprobe array according to one embodiment of the present invention, wherein the first edge-type microprobe array 110, first spacer 150, second edge-type microprobe array 120, second spacer 160, third edge-type microprobe array 130, third spacer 170 and fourth edge-type microprobe array 140 are sequentially assembled together. Refer to FIG. 3 a diagram schematically showing an assembly structure for a three-dimensional microprobe array according to one embodiment of the present invention. In the present invention, the shapes of the edge-type microprobe arrays and the spacers are appropriately designed to reveal all the conductive pads and benefit wire-bonding. In this embodiment, the first spacer 150 is attached to the substrate 111 of the first edge-type microprobe array 110 but reveals the conductive pads 115 of the first edge-type microprobe array 110; then, the second edge-type microprobe array 120 is attached to the first spacer 150, and the substrate 121 of the second edge-type microprobe array 120 is separated from the substrate 111 of the first edge-type microprobe array 110. Similarly, the second spacer 160 separates the substrate 131 of the third edge-type microprobe array 130 from the substrate 121 of the second edge-type microprobe array 120 but reveals the conductive pads 125 of the second edge-type microprobe array 120. The third spacer 170 separates the substrate 141 of the fourth edge-type microprobe array 140 from the substrate 131 of the third edge-type microprobe array 130 but reveals the conductive pads 135 of the third edge-type microprobe array 130. The conductive pads 145 of the fourth edge-type microprobe array 140 are directly exposed on the surface of the three-dimensional structure. Thereby, a 4×4 three-dimensional microprobe array 100 is achieved.

In this embodiment, four edge-type microprobe arrays each having four microprobes are used to form a 4×4 microprobe array. In practical application, when a three-dimensional microprobe array assembly structure comprises n pieces of edge-type microprobe arrays, each edge-type microprobe array must possess n pieces of microprobes so that an n times n microprobe array can be obtained.

In the present invention, the microprobe may be static, stretchable or moveable. The stretchable or moveable microprobe may be driven by an electrostatic actuator, electromagnetic actuator, electrothermal actuator, piezoelectric actuator, pneumatic actuator, water-pressure actuator, or oil-pressure actuator.

In the present invention, the edge-type microprobe arrays and the spacers may be separately fabricated and then assembled together. Alternatively, the spacer is directly fabricated on the backside of the corresponding edge-type microprobe array, and then the spacer-containing edge-type microprobe arrays are assembled together. The three-dimensional microprobe array assembly structure of the present invention can be easily assembled with a common flip-chip bonder without using a pre-perforated substrate or a precision three-dimensional alignment device. Besides, the completed product has a smaller volume.

Figure 4:
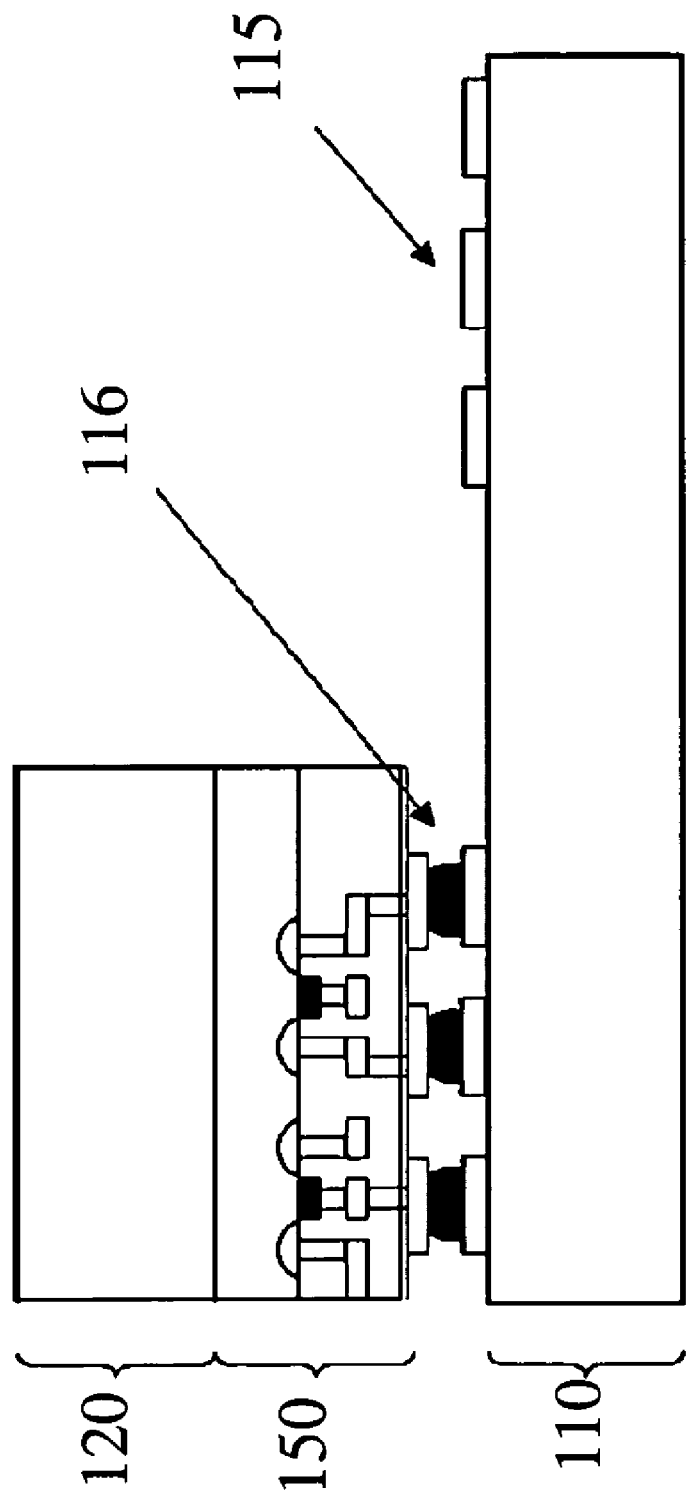
FIG. 4 is a diagram schematically showing the circuit connection structure in a case that the IC substrate is used as a spacer according to one embodiment of the present invention.

In integrating a common edge-type microprobe array with IC, a portion of silicon substrate must be reserved for fabricating probes, which will increase the area of the silicon substrate and raise the cost. In the present invention, a substrate, which IC is fabricated on, is directly used as the spacer, and the integration of the edge-type microprobe array and IC is thus easily achieved. The edge-type microprobe array may be connected with the spacer in the way shown in FIG. 4, wherein conductive pads 116 are fabricated on the first edge-type microprobe array 110 to connect with the IC-containing spacer 150. The methods for connecting the second edge-type microprobe array 120 with the IC-containing spacer 150 may be a flip-chip packaging method or other chip bonding methods. The substrate for fabricating the spacer or edge-type microprobe array may be a III-V group substrate, a glass substrate, a polymer substrate, or another substrate suitable for fabricating microprobes.

The feature of the edge-type microprobe array is that each microprobe has a plurality of sensing electrodes to detect signals from different depths. In the present invention, all the microprobes may have an identical length. The microprobes may also have different lengths to simultaneously detect the biological tissues in different depths, wherein long microprobes and short microprobes are arranged alternately. The lengths of the microprobes may also vary in other modes. Refer to from FIG. 5A to FIG. 5I for the fabrication process exemplified by fabricating the fourth edge-type microprobe array 140.

Firstly, as shown in FIG. 5A, a blank silicon substrate 401 is provided. Next, as shown in FIG. 5B, an insulating layer 402 is formed on the upper surface of the silicon substrate 401 with a deposition method or an oxidation method. Next, as shown in FIG. 5C, a metal trace 403 is formed on the insulating layer 402 with a semiconductor method, including deposition, photolithography, etching, etc. Next, as shown in FIG. 5D, an insulating layer 404 is formed on the metal trace 403 with a deposition method. Next, as shown in FIG. 5E, parts of the metal trace 403, which are to be connected with sensing electrodes, are revealed with a semiconductor method, including photolithography, etching, etc. Next, as shown in FIG. 5F, metal sensing electrodes 405 are formed on the holes fabricated in the preceding step with a semiconductor method, including deposition, photolithography, etching, etc. Next, as shown in FIG. 5G, parts of the metal trace 403, which are to function as the conductive pads 145, are revealed with a semiconductor method, including photolithography, etching, etc. Next, as shown in FIG. 5H, the contour of the fourth edge-type microprobe array 140 is carved out from the substrate 401 with an etching method. Then, as shown in FIG. 5I, the fourth edge-type microprobe array 140 is taken out from the substrate 401.

The spacer 70, which is needed in assembling a three-dimensional microprobe array, can be directly carved out from a blank silicon substrate and then assembled with the fourth edge-type microprobe array 140.

Alternatively, the spacer is directly formed on the back of the edge-type microprobe array. In other words, the fourth edge-type microprobe array 140, together with the spacer 70, is fabricated into a one-piece component. Refer to from FIG. 5J to FIG. 5L for the process of this embodiment. After the step shown in FIG. 5G, a portion of the back of the substrate 401, which will accommodate another edge-type microprobe array, is thinned with a photolithography method, an etching method, etc., as shown in FIG. 5J. The other portion of the back of the substrate 401, which is not thinned in the step shown in FIG. 5J, is used as the spacer 70. Next, as shown in FIG. 5K, the contour of the fourth edge-type microprobe array 140 is carved out from the substrate 401 with an etching method. Then, as shown in FIG. 5L, the fourth edge-type microprobe array 140 is taken out from the substrate 401.

Figure 6:
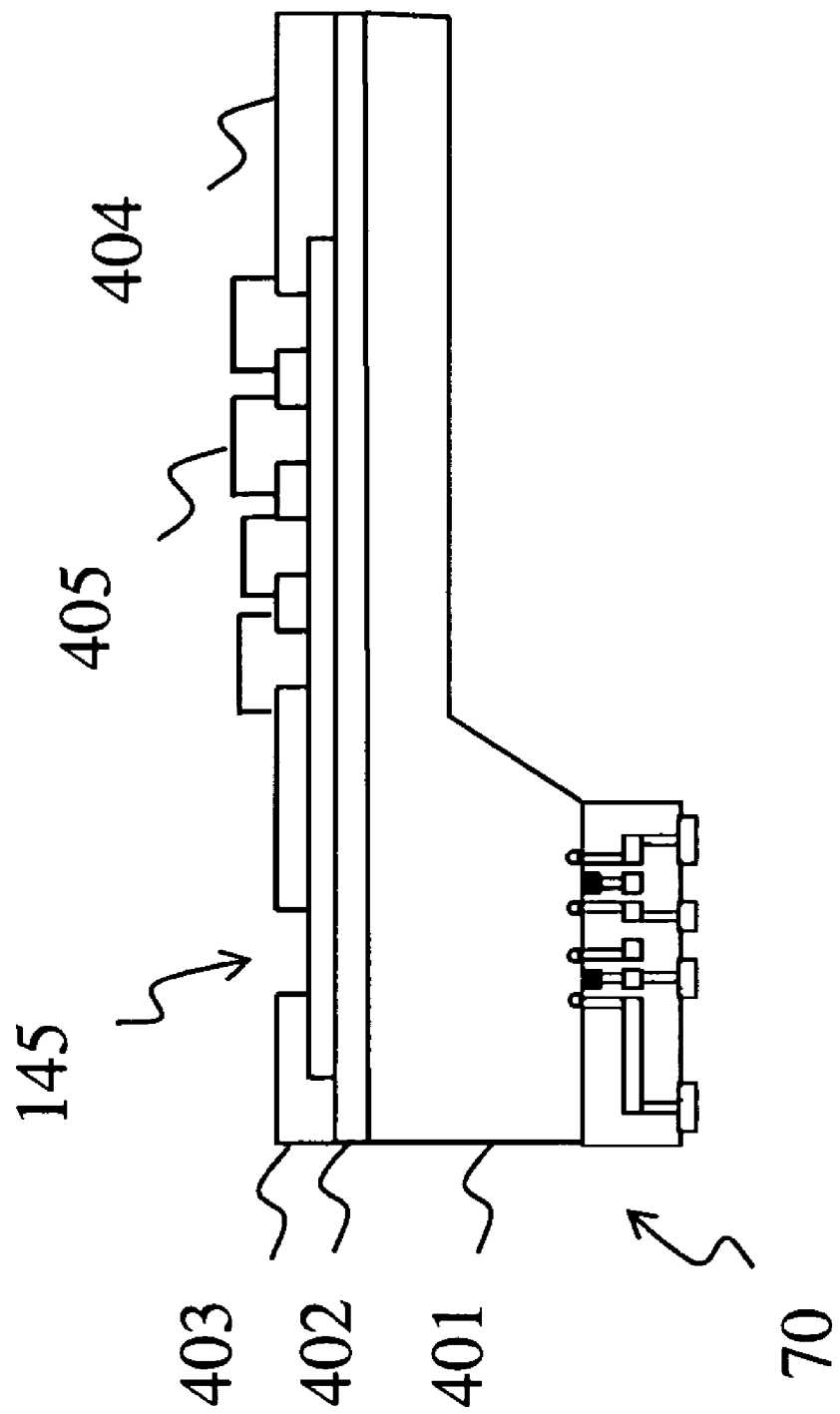
FIG. 6 is a diagram schematically showing that a portion of the silicon substrate of a spacer is used as the IC substrate.

It should be noted that the portion of substrate 401, which is preserved to function as the spacer 70, may also function as the IC substrate, as shown in FIG. 6.

Figure 7:
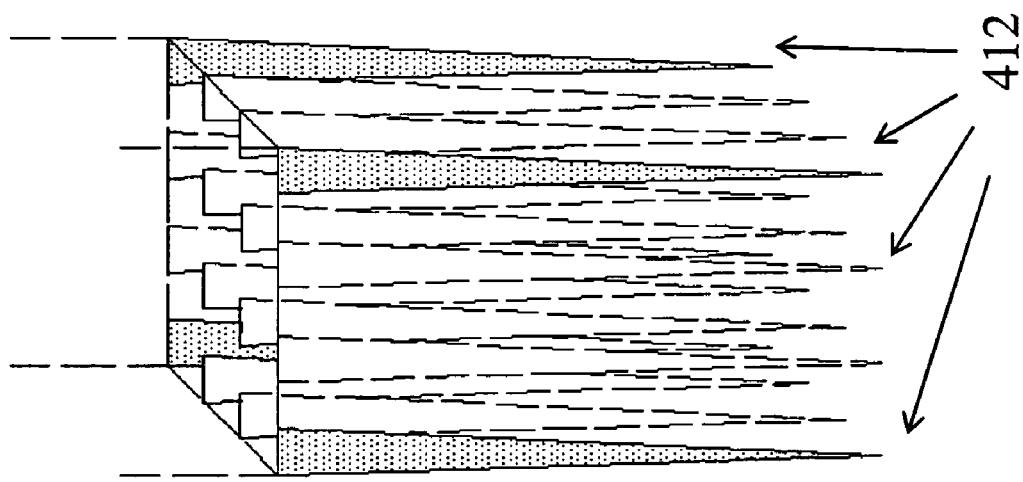
FIG. 7 is a diagram schematically showing a depth- and angle-detection three-dimensional microprobe array assembly structure according to one embodiment of the present invention.
Figure 8B:
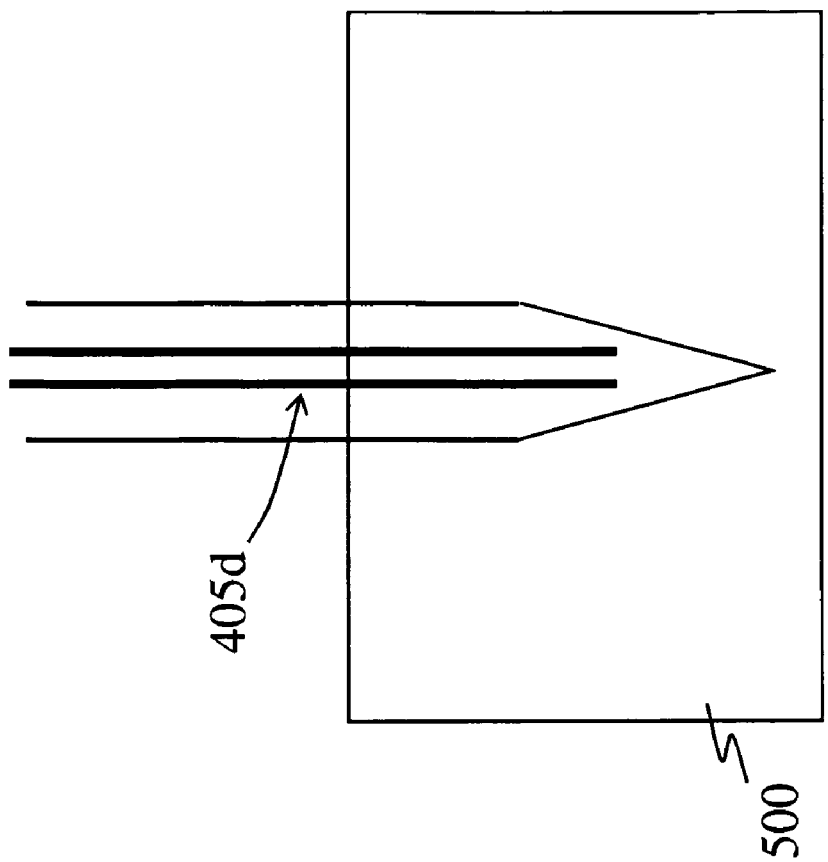
FIG. 8A and FIG. 8B are diagrams respectively schematically showing a digital depth detection method and an analog depth detection method for a three-dimensional microprobe array assembly structure with depth and angle detection according to one embodiment of the present invention.
Figure 8A:
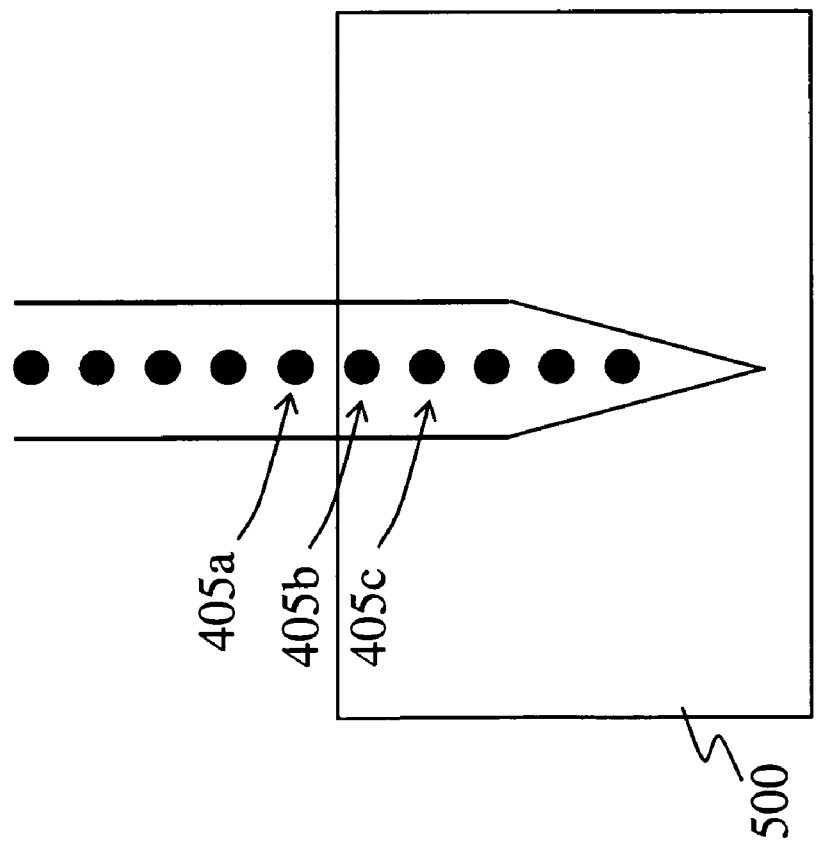

Below is described with a 4×4 three-dimensional microprobe array the designs and mechanisms of the three-dimensional microprobe array assembly structure with depth and angle detection. Refer to FIG. 7. The three-dimensional microprobe array assembly structure with depth and angle detection can be realized with four depth- and angle-detection microprobes 412 respectively arranged at four corners. The detection methods thereof include a digital detection method and an analog detection method. Refer to FIG. 8A. In the digital detection method, conductivity tests are performed for each two electrodes of a row of sensing electrodes on the microprobe. The cell tissue 500 has conductivity higher than that of the external (such as air). Therefore, the impedance between the (k−1)th electrode 405a and the kth electrode 405b is much higher than that between the kth electrode 405b and the (k+1)th electrode 405c. Thereby, it is known that the insertion depth is between the (k−1)th electrode 405a and the kth electrode 405b. As the distance between each two neighboring electrodes is a given value, the approximate physical insertion depth can be obtained. The resolution of the digital detection method correlates with the distance between the electrodes. The closer the electrodes, the higher the resolution. Refer to FIG. 8B. In the analog detection method, two parallel naked conduction lines 405d are arranged on the microprobe 412, and the impedance therebetween is detected. The greater the insertion depth, the larger the cell tissue area the current flows through, and the lower the impedance. The detected impedance can be converted into a physical depth. The analog detection method needs an additional conversion circuit. Nevertheless, the analog detection method has a resolution higher that of the digital detection method.

The digital detection method has an advantage that the four microprobes at four corners can also function as common sensing electrodes after the depth detection is completed. Contrarily, the depth-detection microprobes of the analog detection method can only be used in depth detection but cannot function as common sensing electrodes.

Figure 9B:
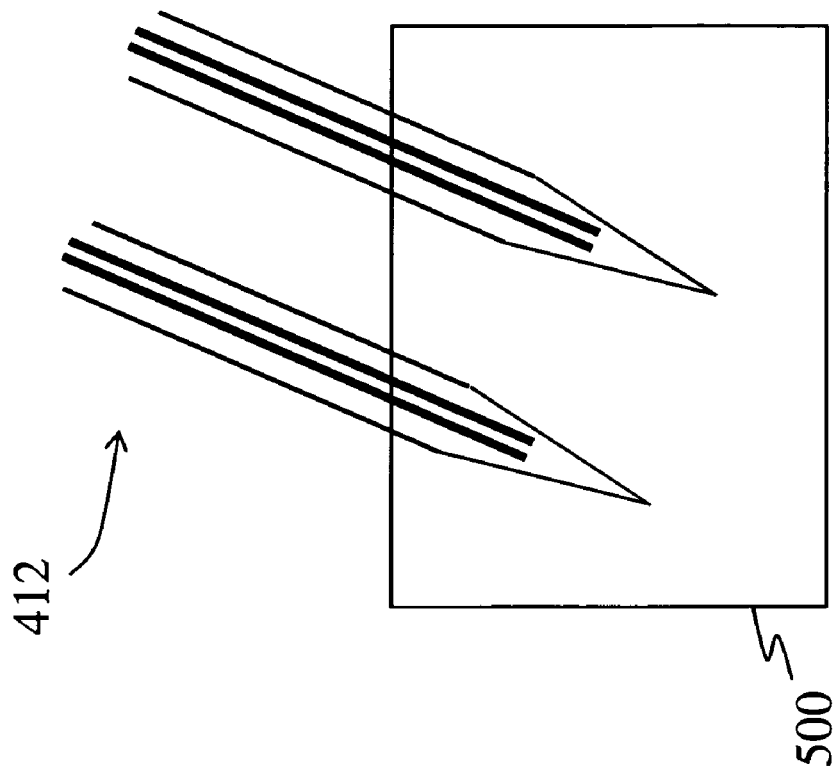
FIG. 9A and FIG. 9B are diagrams respectively schematically showing a digital angle detection method and an analog angle detection method for a three-dimensional microprobe array assembly structure with depth and angle detection according to one embodiment of the present invention.
Figure 9A:
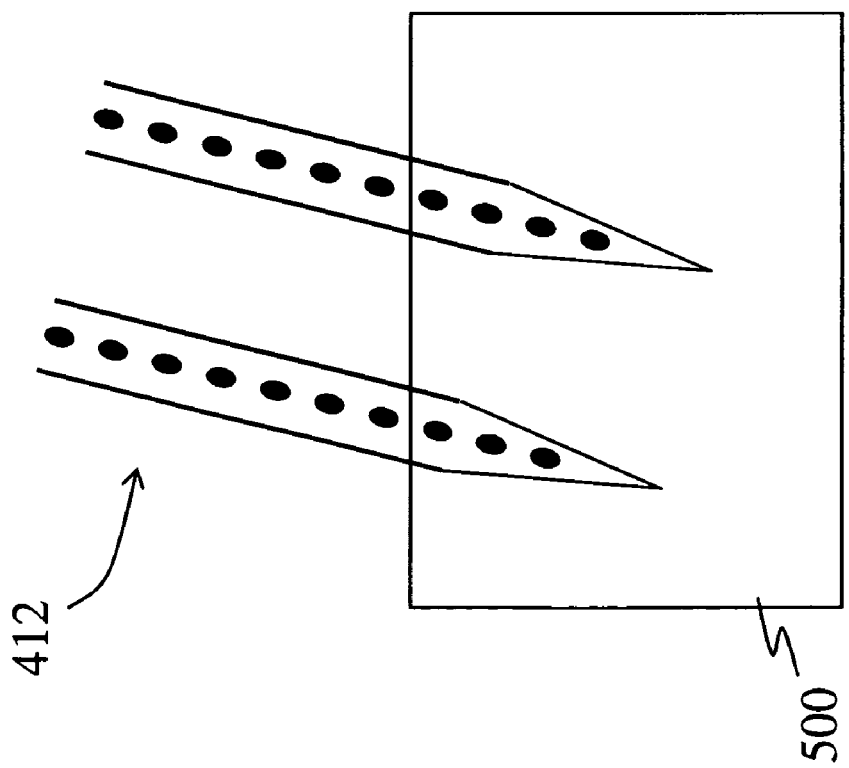

The three-dimensional microprobe array assembly structure may not always be inserted into cell tissue so vertically as expected. Refer to FIG. 9A and FIG. 9B. When the microprobes 412 are inserted into cell tissue by an angle, the microprobes 412 at four corners will respectively have different insertion depths. Thus, the insertion angle can be calculated. Knowing the insertion depth and angle can verify whether the insertion position is correct and thus can increase test reliability. In the present invention, the three-dimensional microprobe array assembly structure may also use a single microprobe or a plurality of microprobes not arranged at four corners to perform depth detection. Besides, the present invention may also adopt other impedance-detection mechanisms to determine the depths and angles of the microprobes.

The three-dimensional microprobe array assembly structure of the present invention can extensively apply to physiological inspection systems, particularly to EEG (electroencephalography), EOG (electro-oculography) and ECG (electrocardiography), and provide a convenient interface for the field of physiological monitoring. The present invention can be mass-fabricated with a batch-production technology to provide cost- and quality-efficient products and thus has a great commercial potential.

The embodiments described above are only to exemplify the present invention but not to limit the scope of the present invention. Any equivalent modification or variation according to the spirit of the present invention is to be also included within the scope of the present invention, which is based on the claims stated below.

What is claimed is:

1. A three-dimensional microprobe array assembly structure comprising:
   at least two edge-type microprobe arrays disposed in stacked arrangement, wherein each said edge-type microprobe array has a substrate, and said substrate has at least two microprobes at a front thereof, and each microprobe is connected with a plurality of conductive pads on said substrate via a plurality of wires; and,
   a spacer applied in parallel relation to said edge-type microprobe arrays and separating said stacked arrangement of two edge-type microprobe arrays, and revealing said conductive pads of said two edge-type microprobe arrays.

2. The three-dimensional microprobe array assembly structure of claim 1, wherein each microprobe has at least one sensing electrode.

3. The three-dimensional microprobe array assembly structure of claim 2, wherein said sensing electrode is arranged in a front, middle, or rear of said microprobe.

4. The three-dimensional microprobe array assembly structure of claim 2, wherein when said microprobes have different lengths, long said microprobes and short said microprobes are arranged in an alternating mode.

5. The three-dimensional microprobe array assembly structure of claim 2, wherein at least one of said microprobes detects depths.

6. The three-dimensional microprobe array assembly structure of claim 2, wherein at least two of said microprobes detect angles.

7. The three-dimensional microprobe array assembly structure of claim 1, wherein said spacer is an IC (integrated Circuit) substrate.

8. The three-dimensional microprobe array assembly structure of claim 1, wherein said spacer is made of an III-V group compound, a glass, or a polymer.

9. The three-dimensional microprobe array assembly structure of claim 1, wherein said substrate of said edge-type microprobe array is made of an III-V group compound, a glass, or a polymer.

10. The three-dimensional microprobe array assembly structure of claim 1, wherein when there are n pieces of said edge-type microprobe arrays, each said edge-type microprobe array has n pieces of microprobes, and all said edge-type microprobe arrays form an n times n matrix microprobe array; wherein n is a positive integer.

11. The three-dimensional microprobe array assembly structure of claim 1 further comprising another edge-type microprobe array, which is assembled to and separated from said edge-type microprobe arrays via another spacer.

12. The three-dimensional microprobe array assembly structure of claim 11, wherein said another spacer reveals conductive pads of said another edge-type microprobe array.

13. The three-dimensional microprobe array assembly structure of claim 1 further comprising a plurality of edge-type microprobe arrays, which are assembled to and separated from said edge-type microprobe arrays via a plurality of spacers.

14. The three-dimensional microprobe array assembly structure of claim 13, wherein said spacers reveal conductive pads of said edge-type microprobe arrays.

15. The three-dimensional microprobe array assembly structure of claim 1, wherein said spacer is assembled to said edge-type microprobe array via a flip-chip method.

16. The three-dimensional microprobe array assembly structure of claim 1, wherein one said spacer and one said edge-type microprobe array are fabricated into a one-piece component.

17. The three-dimensional microprobe array assembly structure of claim 1, wherein each microprobe is a static, stretchable, or moveable microprobe.

18. The three-dimensional microprobe array assembly structure of claim 17, wherein said stretchable or moveable microprobe is driven by an electrostatic actuator, electromagnetic actuator, electrothermal actuator, piezoelectric actuator, pneumatic actuator, water-pressure actuator, or oil-pressure actuator.

19. The three-dimensional microprobe array assembly structure of claim 1, wherein said edge-type microprobe arrays and said spacer are separately fabricated and then assembled together.

20. The three-dimensional microprobe array assembly structure of claim 1, wherein said spacer is directly fabricated on a backside of a corresponding said edge-type microprobe array, and then said edge-type microprobe arrays each containing said spacer are assembled together.

* * * * *